United States Patent
Hong

(10) Patent No.: US 7,786,560 B2
(45) Date of Patent: Aug. 31, 2010

(54) MEMS PACKAGE STRUCTURE

(75) Inventor: Li-Ching Hong, Tainan (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 57 days.

(21) Appl. No.: 12/233,898

(22) Filed: Sep. 19, 2008

(65) Prior Publication Data

US 2009/0115007 A1 May 7, 2009

(30) Foreign Application Priority Data

Nov. 7, 2007 (TW) .............................. 96142074 A

(51) Int. Cl.
*H01L 23/02* (2006.01)
(52) U.S. Cl. ...................... 257/680; 257/415
(58) Field of Classification Search .............. 257/415, 257/666, 678, 690, 754, E29.324, E21.499, 257/E21.705, 680; 438/107, 108, 460
See application file for complete search history.

(56) References Cited

U.S. PATENT DOCUMENTS

| 6,661,084 | B1 * | 12/2003 | Peterson et al. ............ 257/680 |
| 2003/0215974 | A1 * | 11/2003 | Kawasaki et al. ............ 438/50 |
| 2008/0128841 | A1 * | 6/2008 | Fujimori et al. ............ 257/418 |

* cited by examiner

*Primary Examiner*—Thomas L Dickey
*Assistant Examiner*—Nikolay Yushin
(74) *Attorney, Agent, or Firm*—J.C. Patents

(57) ABSTRACT

A package structure including a chip, a lid, a substrate, a plurality of wires, an encapsulant, and a moisture resistive layer is provided. The chip has an active area where at least one MEMS device is disposed. The lid is covered on the chip, and the substrate is used to carry the chip and the lid. The plurality of wires is electrically connected between the substrate and the chip. The encapsulant is sealed around the lid and exposes an upper surface of the lid. The moisture resistive layer is covered on the encapsulant to enhance the airtightness and the moisture resistance of the encapsulant.

12 Claims, 2 Drawing Sheets

MEMS PACKAGE STRUCTURE

CROSS-REFERENCE TO RELATED APPLICATION

This application claims the priority benefit of Taiwan application serial no. 96142074, filed on Nov. 7, 2007. The entirety of the above-mentioned patent application is hereby incorporated by reference herein and made a part of specification.

BACKGROUND OF THE INVENTION

1. Field of the Invention

The present invention generally relates to a chip package structure, in particular, to a microelectromechanical system (MEMS) package structure.

2. Description of Related Art

Microelectromechanical system (MEMS) is a microelectromechanical device fabricated in a microminiaturized package structure, and the fabricating technique thereof is quite similar to the technique of fabricating integrated circuits (ICs). However, interactions, for example, about mechanics, optics, or magnetic force between the MEMS device and surrounding environment are more than that of the conventional IC.

The MEMS device may include micro-sized electromechanical components (for example, switches, mirrors, capacitors, accelerometers, sensors, capacitive sensors, or actuators etc.), and the MEMS device may be integrated with the IC in a manner of single block, thereby greatly modifying insertion loss or electrical isolation effect of the overall solid-state device. However, in the macroscopic world of the entire package structure, the MEMS device is extremely weak and may be impacted by slight static electricity or surface tension at any moment to cause failure. Therefore, in order to prevent the MEMS device from contaminations or damages, usually the MEMS device is sealed in a cavity between the wafer and the lid.

FIG. 1 is a schematic view of a conventional MEMS package. Referring to FIG. 1, a cover plate (lid) 110 is fixed on a wafer 100 with a sealant 112, such that MEMS devices 104 are sealed in a cavity 106 between the wafer 100 and the cover plate 110. Next, the wafer 100 and the cover plate 110 are cut into independent units, such that the MEMS devices 104 are sealed in the independent MEMS structures. The MEMS devices 104 are protected in the cavity 106, so as to ensure that the MEMS devices 104 operate normally. Next, the MEMS structures are sealed with an encapsulant (not shown), and thus the MEMS package structure is completed.

However, when an organic polymer compound is used as the sealant 112 or the encapsulant, it is impossible to totally isolating the moisture. After a long time, the airtightness of the sealant 112 or the encapsulant becomes worse, thereby affecting the normal operation of the MEMS devices 104.

SUMMARY OF THE INVENTION

Accordingly, the present invention is directed to a package structure, which adopts a moisture resistive material to enhance the airtightness and moisture resistivity of the encapsulant.

The present invention provides a package structure, which includes a chip, a lid, a substrate, a plurality of wires, an encapsulant, and a moisture resistive layer. The chip has an active area where at least one MEMS device is disposed. The lid is covered on the chip, and the substrate is used to carry the chip and the lid. The plurality of wires is electrically connected between the substrate and the chip. The encapsulant is sealed around the lid and exposes an upper surface of the lid. The moisture resistive layer is covered on the encapsulant to enhance the airtightness and the moisture resistivity of the encapsulant.

In an embodiment of the present invention, a material of the encapsulant includes an organic polymer material, for example, epoxy resin. The encapsulant is formed by dispensing.

In an embodiment of the present invention, a material of the moisture resistive layer includes an inorganic insulating material, for example, silica, silicon nitride, or silicon oxynitride. The moisture resistive layer is formed by chemical vapour deposition (CVD) or physical vapour deposition (PVD).

In an embodiment of the present invention, the package structure further includes a sealant connected between the chip and the lid and sealing the MEMS device.

In another embodiment of the present invention, the package structure further includes a sealant connected between the substrate and the lid and sealing the chip and the wires.

In the MEMS package structure of the present invention, a first sealing step is first performed with the encapsulant (organic polymer material), and then a second step of achieving moisture resistance is performed with another moisture resistive material (inorganic insulating material) of a higher compaction that is covered on the organic polymer material, thereby enhancing the airtightness and the moisture resistance of the encapsulant.

In order to have a further understanding of the features and the advantages of the present invention, a detailed description is given as follows with the embodiment and the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
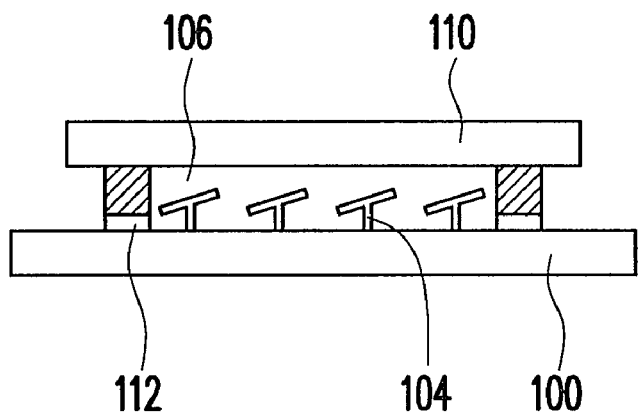
FIG. 1 is a schematic view of a conventional MEMS package.

Reference will now be made in detail to the present embodiments of the invention, examples of which are illustrated in the accompanying drawings. Wherever possible, the same reference numbers are used in the drawings and the description to refer to the same or like parts.

Figure 2:
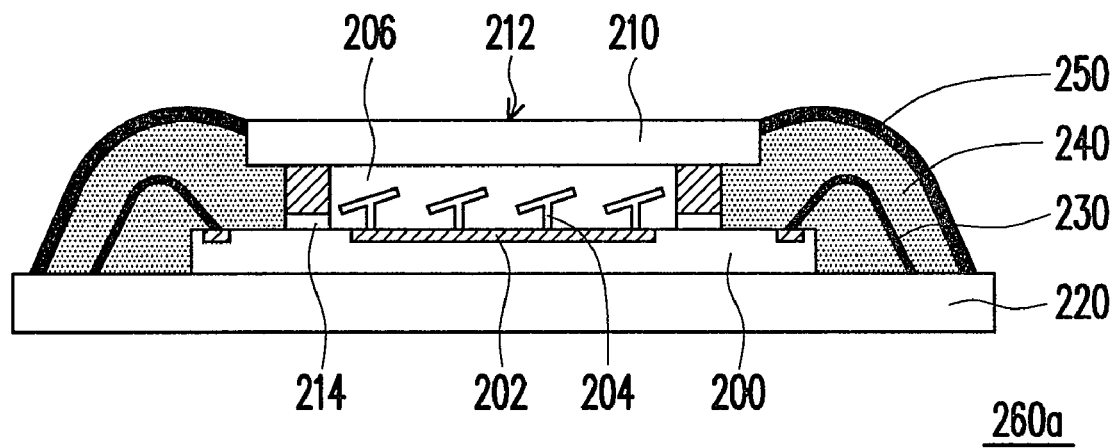
FIG. 2 is a schematic view of a package structure according to an embodiment of the present invention.
Figure 3:
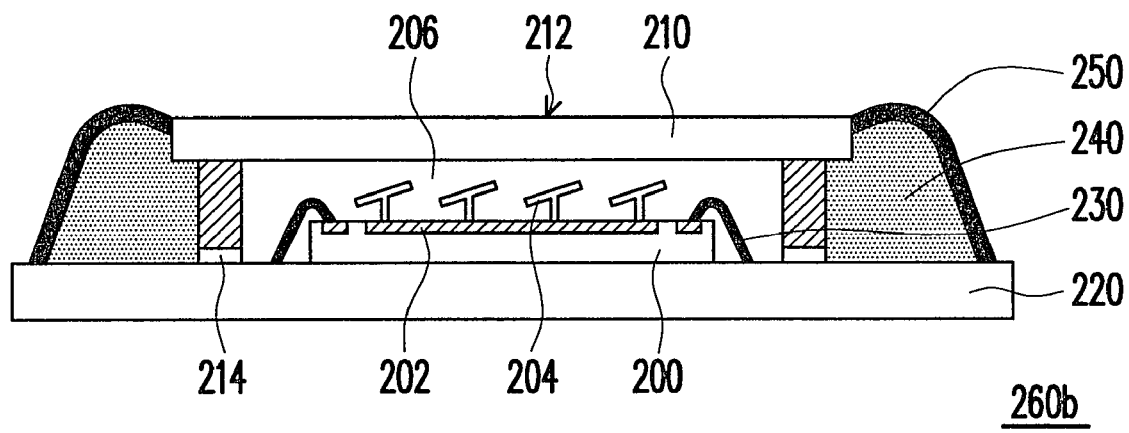
FIG. 3 is a schematic view of a package structure according to another embodiment of the present invention.

FIG. 2 is a schematic view of a package structure according to an embodiment of the present invention, and FIG. 3 is a schematic view of a package structure according to another embodiment of the present invention.

The package structure 260a includes a chip 200, a lid 210, a substrate 220, a plurality of wires 230, an encapsulant 240, and a moisture resistive layer 250. The chip 200 has an active area 202 where at least one MEMS device 204 is disposed. The lid 210 is covered on the chip 200, and the lid 210 has an upper surface 212. The substrate 220 is used to carry the chip 200 and the lid 210. The plurality of wires 230 is electrically connected between the substrate 220 and the chip 200. The encapsulant 240 is sealed around the lid 210, and exposes the upper surface 212 of the lid 210. The moisture resistive layer 250 is covered on the encapsulant 240. The chip 200 is, for example, an optical sensor chip such as a charge couple device (CCD) or a complementary metal-oxide-semiconductor (CMOS), and the active area 202 is, for example, a photo sensitive region.

Referring to FIG. 2, in this embodiment, the lid 210 (for example, a glass substrate) is fixed on the wafer (not shown) with a sealant 214 and a metal ring (for example, a copper ring, indicated by the slash) located above the sealant 214, so as to seal the MEMS devices 204 in the cavities 206 between the wafer and the lid 210. Then, the wafer and the lid 210 are cut into the independent units, such that the MEMS devices 204 are sealed in the independent MEMS structures respectively. Next, the MEMS structures are disposed on the substrate 220, and the plurality of wires 240 is electrically connected between the substrate 220 and the chip 200 by wire-bonding. Then, the encapsulant 240 is sealed around the lid 210 by dispensing, and exposes the upper surface 212 of the lid 210, such that the photo sensitive region of the optical sensor chip may receive light rays passing through the lid 210 for performing the subsequent image processing.

It should be noted that the encapsulant 240 is an organic polymer compound, for example, an epoxy resin. The molecular structure of the organic compound has many hydrophilic groups, thus having the ability to block the external contamination and moisture, but the molecular structure cannot totally block the reaction of the hydrophilic groups and the moisture. Therefore, in the present invention, a moisture resistive layer 250 is formed by the CVD or PVD technique, and is covered on the encapsulant 240, so as to effectively block the reaction of the hydrophilic groups of the encapsulant 240 and the moisture. In this manner, the MEMS device 204 may operate normally in the MEMS package structure 260a.

In this embodiment, a material of the moisture resistive layer 250 is an inorganic insulating material with a higher compaction, for example, silica, silicon nitride, silicon oxynitride, or other nitride, oxide, and oxynitride which do not contain the hydrophilic group, so the moisture resistance is stronger than that of the encapsulant 240. That is, the inorganic insulating material does not have the hydrophilic group, and will not react with the moisture, thereby effectively isolating the moisture. After a long time, the airtightness of the sealant 214 or the encapsulant 240 remains unchanged.

In a next embodiment, similarly the moisture resistive layer 250 is covered on the encapsulant 240, and only a part of the structure is slightly changed. The lid 210 is, for example, a light-transmissive substrate or an opaque silicon substrate. The details are illustrated as follows.

Referring to FIG. 3, in this embodiment, a back side of the chip 200 is adhered to the substrate 220, and the plurality of wires 230 is electrically connected between the substrate 220 and the chip 200 by wire-bonding. Next, the lid 210 is fixed on the substrate 220 with the sealant 214 and the metal ring (the slash part) located above the sealant 214, so as to seal the chip 200 with the MEMS devices 204 and the plurality of wires 230 in the cavity 206 between the substrate 220 and the lid 210. Then, the encapsulant 240 is sealed around the lid 210 by dispensing, and exposes the upper surface 212 of the lid 210. In this manner, the MEMS device 204 may operate normally in the MEMS package 260b.

In the above two embodiments, in the MEMS package of the present invention, a first sealing step is performed with the encapsulant (the organic polymer material), and then a second step of achieving moisture resistance is performed with another moisture resistive material (the inorganic insulating material) of a higher compaction which is covered on the organic polymer material. Therefore, the switch, the mirror, the capacitor, the accelerometer, the sensor, the capacitive sensor, the actuator, or other MEMS devices may be sealed in the cavity, and the external contamination and moisture can be prevented, thereby effectively enhancing the operating reliability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package structure, comprising:
   a chip, comprising an active area where at least one microelectromechanical system (MEMS) device is disposed;
   a lid, covering the chip, and comprising an upper surface;
   a substrate, carrying the chip and the lid, wherein the at least one MEMS device is disposed in a cavity between the chip and the lid;
   a metal ring, disposed between the substrate and the lid;
   a plurality of wires, electrically connecting the substrate and the chip;
   an encapsulant, sealed around the lid and the metal ring and exposing the upper surface of the lid; and
   a moisture resistive layer, covering the encapsulant and exposing the upper surface of the lid.

2. The package structure according to claim 1, wherein a material of the encapsulant comprises an organic polymer material.

3. The package structure according to claim 2, wherein a material of the encapsulant comprises epoxy resin.

4. The package structure according to claim 2, wherein the encapsulant is formed by dispensing.

5. The package structure according to claim 1, wherein a material of the moisture resistive layer comprises an inorganic insulating material.

6. The package structure according to claim 5, wherein the material of the moisture resistive layer comprises silica, silicon nitride, or silicon oxynitride.

7. The package structure according to claim 5, wherein the moisture resistive layer is formed by chemical vapour deposition (CVD) or physical vapour deposition (PVD).

8. The package structure according to claim 1, wherein the chip is an optical sensor chip, and the active area is a photo sensitive region.

9. The package structure according to claim 1, wherein the lid comprises a light-transmissive substrate or an opaque substrate.

10. The package structure according to claim 1, further comprising a sealant disposed between the chip and the metal ring that is disposed on the chip, connecting the chip and the lid, and sealing the MEMS device on the chip.

11. The package structure according to claim 1, further comprising a sealant disposed between the substrate and the metal ring that is disposed on the substrate, connecting the substrate and the lid, and sealing the chip and the wires.

12. The package structure according to claim 1, wherein a moisture resistance of the moisture resistive layer is higher than that of the encapsulant.

* * * * *